(12) United States Patent
Kim et al.

(10) Patent No.: US 8,103,976 B2
(45) Date of Patent: *Jan. 24, 2012

(54) PHOTO MASK SET FOR FORMING MULTI-LAYERED INTERCONNECTION LINES AND SEMICONDUCTOR DEVICE FABRICATED USING THE SAME

(75) Inventors: Sung-Jin Kim, Seoul (KR);
Seung-Hyun Chang, Gyeonggi-do (KR); Ki-Heum Nam, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 956 days.

This patent is subject to a terminal disclaimer.

(21) Appl. No.: 11/839,478

(22) Filed: Aug. 15, 2007

(65) Prior Publication Data

US 2007/0273029 A1   Nov. 29, 2007

Related U.S. Application Data

(62) Division of application No. 10/685,655, filed on Oct. 14, 2003, now Pat. No. 7,271,492.

(30) Foreign Application Priority Data

Feb. 7, 2003   (KR) .................................. 2003-7940

(51) Int. Cl.
*G06F 17/50* (2006.01)
(52) U.S. Cl. ........................... 716/50; 438/622; 257/758
(58) Field of Classification Search ................ 716/1, 21, 716/100, 50; 438/622; 257/758
See application file for complete search history.

(56) References Cited

U.S. PATENT DOCUMENTS

| | | | |
|---|---|---|---|
| 5,242,770 A | 9/1993 | Chen et al. | |
| 5,922,495 A | 7/1999 | Kim | |
| 5,945,740 A * | 8/1999 | Kawazoe | 257/776 |
| 6,160,296 A * | 12/2000 | Violette et al. | 257/377 |
| 6,261,883 B1 * | 7/2001 | Koubuchi et al. | 438/197 |
| 6,709,972 B2 * | 3/2004 | Park | 438/622 |
| 6,927,471 B2 * | 8/2005 | Salmon | 257/499 |
| 7,271,492 B2 * | 9/2007 | Kim et al. | 257/776 |
| 2001/0017418 A1 * | 8/2001 | Noguchi et al. | 257/758 |
| 2001/0026975 A1 * | 10/2001 | Ando | 438/253 |
| 2003/0127677 A1 * | 7/2003 | Park et al. | 257/300 |
| 2003/0222349 A1 * | 12/2003 | Tomohisa et al. | 257/758 |
| 2004/0155346 A1 * | 8/2004 | Kim et al. | 257/758 |
| 2005/0037605 A1 * | 2/2005 | Kim et al. | 438/622 |

FOREIGN PATENT DOCUMENTS

| | | |
|---|---|---|
| JP | 2002-064043 | 2/2002 |
| KR | 1020020052609 A | 7/2002 |
| KR | 2002-0085803 | 11/2002 |

* cited by examiner

*Primary Examiner* — Suchin Parihar
(74) *Attorney, Agent, or Firm* — Volentine & Whitt, PLLC

(57) ABSTRACT

A photo mask set for forming multi-layered interconnection lines and a semiconductor device fabricated using the same includes a first photo mask for forming lower interconnection lines and a second photo mask for forming upper interconnection lines. The first and second photo masks have lower opaque patterns parallel with each other and upper opaque patterns that overlap the lower opaque patterns. In this case, ends of the lower opaque patterns are located on a straight line that crosses the lower opaque patterns. As a result, when upper interconnection lines are formed using the second photo mask, poor photo resist patterns can be prevented from being formed despite the focusing of reflected light.

10 Claims, 13 Drawing Sheets

US 8,103,976 B2

PHOTO MASK SET FOR FORMING MULTI-LAYERED INTERCONNECTION LINES AND SEMICONDUCTOR DEVICE FABRICATED USING THE SAME

CROSS-REFERENCE TO RELATED APPLICATIONS

This application is a Divisional of U.S. patent application Ser. No. 10/685,655, filed on Oct. 14, 2003, now pending, which claims priority from Korean Patent Application No. 2003-0007940, filed on Feb. 7, 2003, the contents of which are herein incorporated by reference in their entirety.

BACKGROUND OF THE INVENTION

1. Field of the Invention

This disclosure relates to a photo mask set and a semiconductor device fabricated using the same and, more particularly, to a photo mask set for forming multi-layered interconnection lines and a semiconductor device fabricated using the same.

2. Description of Related Art

As semiconductor devices become more highly integrated, a multi-layered interconnection technique has been widely used in fabrication of the semiconductor devices. The multi-layered interconnection technique includes forming lower interconnection lines on a semiconductor substrate, forming an interlayer insulating layer on an entire surface of the substrate having lower interconnection lines, and forming upper interconnection lines on the interlayer insulating layer.

Meanwhile, the lower interconnection lines or the upper interconnection lines are typically formed by sequentially forming a conductive layer and a photoresist layer, forming a photoresist pattern using a photolithography technique with a photo mask, and etching the conductive layer using the photoresist pattern as an etching mask.

The photo mask includes a transparent substrate and opaque layer patterns formed on the transparent substrate. The width of the opaque layer patterns and the spaces therebetween should be reduced in order to realize the highly integrated semiconductor devices. In this case, a proximity effect easily occurs during the photolithography process. The proximity effect may cause degradation of the resolution limit. Therefore, various photo masks and diverse fabrication methods of the photo masks have been proposed in order to suppress the proximity effect.

Photo masks for reducing the proximity effect are taught in U.S. Pat. No. 5,242,770 by Chen, et al. entitled "MASK FOR PHOTOLITHOGRAPHY", which is incorporated herein by reference.

FIG. 1A and FIG. 1B are plan diagrams illustrating a first photo mask for forming lower interconnection lines and a second photo mask for forming upper interconnection lines, respectively, and the first and second photo masks are described in the U.S. Pat. No. 5,242,770. FIG. 1C is a is a plan diagram illustrating the first photo mask and the second photo mask aligned with the first photo mask.

Referring to FIG. 1A, a first lower opaque pattern 20a, a second lower opaque pattern 20b, and a third lower opaque pattern 20c are positioned parallel to each other on a first transparent substrate 1. The second lower opaque pattern 20b is interposed between the first and third lower opaque patterns 20a and 20c. In addition, the first and third lower opaque patterns 20a and 20c extend past the end of the second lower opaque pattern 20b.

Furthermore, intensity-leveling bars (not shown) are located in appropriate positions in order to reduce the proximity effect. The intensity-leveling bars do not have large sizes (e.g., wide widths), which are sufficient to generate photo resist patterns on a semiconductor substrate during the photolithography process.

Referring to FIG. 1B, a first upper opaque pattern 40a, a second upper opaque pattern 40b, and a third upper opaque pattern 40c are positioned parallel to each other on a second transparent substrate 3. The first to third upper opaque patterns 40a, 40b, and 40c are positioned to overlap with the first to third lower opaque patterns 20a, 20b, and 20c, respectively. Other intensity-leveling bars (not shown) may be disposed on the second transparent substrate 3.

Referring to FIG. 1C, the first to third lower opaque patterns 20a, 20b, and 20c are overlaid with the first to third upper opaque patterns 40a, 40b, and 40c, respectively. While the width of the lower opaque patterns is greater than that of the upper opaque patterns, the second upper opaque pattern 40b extends lengthwise past an end of the second lower opaque pattern 20b.

FIG. 2A is a plan diagram useful for explaining multi-layered interconnection lines fabricated using the first and second photo masks illustrated in FIGS. 1A and 1B.

Referring to FIG. 2A, lower interconnection lines 20a', 20b', and 20c', corresponding to the lower opaque patterns 20a, 20b, and 20c, respectively, are formed on a semiconductor substrate. Also, upper interconnection lines 40a', 40b', and 40c', corresponding to the upper opaque patterns 40a, 40b, and 40c, respectively, are formed over the semiconductor substrate.

In this case, a defect region 40b" may be formed at a portion of the second upper interconnection line 40b' that crosses over the end of the second lower interconnection line 20b'.

FIGS. 2B, 2E, and 2F are cross sectional diagrams useful for explaining a method of forming multi-layered interconnection lines using the conventional photo masks shown in FIGS. 1A and 1B. In each of the drawings, a region indicated by a reference character "A" corresponds to a cross sectional diagram taken along a line I-I of FIG. 2A, and a region indicated by a reference character "B" corresponds to a cross sectional diagram taken along a line II-II of FIG. 2A.

Referring to FIG. 2B, a first lower interconnection line to a third lower interconnection line 20a', 20b', and 20c', which are parallel to each other, are formed on a semiconductor substrate 10 using the first photo mask. An interlayer insulating layer 30 is formed on the substrate having the lower interconnection lines 20a', 20b', and 20c'. The interlayer insulating layer 30 may have a surface step difference as shown in FIG. 2B, even though the interlayer insulating layer 30 is planarized. In the drawing of FIG. 2B, a step distance SD is defined as the shortest horizontal distance from the end of the second lower interconnection line 20b' to the point where the interlayer insulting layer 30 has the lowest surface level with respect to the second lower interconnection line 20b'.

An upper conductive layer 40 is formed on the interlayer insulating layer 30. The upper conductive layer 40 has the same surface profile as the interlayer insulating layer 30.

A photoresist layer 50 is coated on the upper conductive layer 40. The photoresist layer 50 is then exposed to a light L1 that passes through the second photo mask. As a result, the photoresist layer 50 is defined to have a first pattern region P1, a second pattern region P2, and a third pattern region P3 corresponding to the first to third upper opaque patterns 40a, 40b, and 40c of FIG. 1B and an exposure region E between the first to third pattern regions P1, P2, and P3. Unfortunately, a portion of the second pattern region P2 underneath the second upper opaque region 40b may be exposed during the exposure process. This is due to a light L2, which is the portion of the light L1 that is irregularly reflected off a sloped surface of the upper conductive layer 40 between the extensions of the first and third lower interconnection lines 20a' and 20c'. This irregular reflection may occur even though the second photo mask employs intensity leveling bars to reduce the proximity effect.

FIG. 2C and FIG. 2D are plan diagrams illustrating the sloped surfaces of the upper conductive layer 40 and a direction of the reflected light L2.

Referring to FIG. 2C, contour lines ① to ⑧ represent points of equal height on the surfaces of the upper conductive layer 40 of the semiconductor substrate. As the number increases from ① to ⑧, the surface of the upper conductive layer 40 becomes lower. Accordingly, there are not only sloped surfaces parallel with the x-axis or the y-axis but also sloped surfaces Sxy directed to axes between the x-axis and the y-axis that are formed near the end of the second lower interconnection line 20b'.

Referring to FIG. 2D, the photoresist layer 50 (shown in FIG. 2B) is coated on the upper conductive layer 40. The photoresist layer 50 is then exposed by the light L1 that passes through the second photo mask, as described with reference to FIG. 2B. As a result, the photo resist layer 50 is defined to have the first pattern region to the third pattern region P1, P2, and P3 corresponding to the first to third upper opaque patterns 40a, 40b, and 40c of FIG. 1B and the exposure region E between the first to third pattern regions P1, P2, and P3. However, a portion of the second pattern region P2 can be exposed during the exposure process. This is due to the light L2, which is irregularly reflected off the sloped surface of the upper conductive layer 40.

In particular, a light L2xy is reflected off the sloped surfaces Sxy, the surfaces Sxy directed to axes between the x-axis and the y-axis, and a part of the light L2x that is parallel to the x-axis is focused on a focus area F1 in the second pattern region P2. A focus distance FD is defined as the distance between the end of the lower interconnection line 20b' and a center of the focus area F1, a minimum focus distance SFD as a shortest distance between the end of the second lower interconnection line 20b' and the focus area F1, and a maximum focus distance LFD as a longest distance between the end of the lower interconnection line 20b' and the focus area F1.

Referring to FIG. 2E, the photoresist layer exposed by the light L1 is developed using a developer. As a result, the first to third photoresist patterns P1, P2, and P3 corresponding to the first to third pattern regions P1, P2, and P3 are formed on the upper conductive layer 40. Also, a thin narrow abnormal region P2' is formed at the focus area F1 in the second photoresist pattern P2 because the photoresist layer at the focus area F1 is exposed by the reflected light L2x and L2xy.

Referring to FIG. 2F, the conductive layer 40 is etched using the first to third photoresist patterns P1, P2, and P3 as etching masks. As a result, the first to third upper interconnection lines 40a', 40b', and 40c' corresponding to the first to third photoresist patterns P1, P2, and P3 are formed. In this case, the second upper interconnection line 40b' includes a defect region 40b" at the focus area F1. This is due to the abnormal region P2' in the second photoresist pattern P2. As a result of this serious flaw, the second upper interconnection line 40b' may be disconnected at the defect region 40b".

As described above, in the case of forming multi-layered interconnection lines, the sloped surface of the upper conductive layer caused by forming the under interconnection lines results in poor photoresist patterns and poor upper interconnection lines, even though a photo mask reducing the proximity effect is used.

Embodiments of the invention address these and other disadvantages of the prior art.

SUMMARY OF THE INVENTION

Embodiments of the invention provide a photo mask set for forming multi-layered interconnection lines, which prevents poor photoresist patterns from being formed.

Other embodiments of the invention provide semiconductor devices fabricated using the photo mask set.

BRIEF DESCRIPTION OF THE DRAWINGS

Features and advantages of the invention will be more readily understood from the following detailed description of specific embodiments thereof when read in conjunction with the accompanying drawings.

DESCRIPTION OF THE PREFERRED EMBODIMENT

Figure 1A:
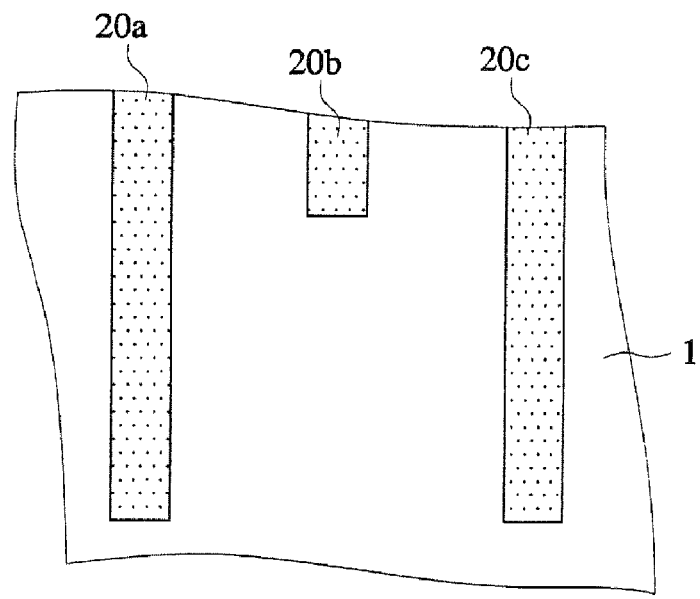
FIGS. 1A and 1B are plan diagrams illustrating a first conventional photo mask for forming lower interconnection lines and a second conventional photo mask for forming upper interconnection lines.
Figure 1B:
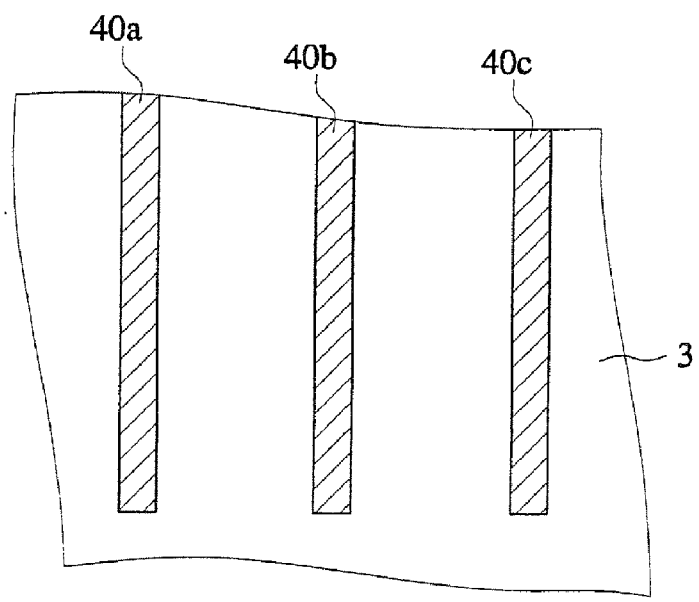
Figure 1C:
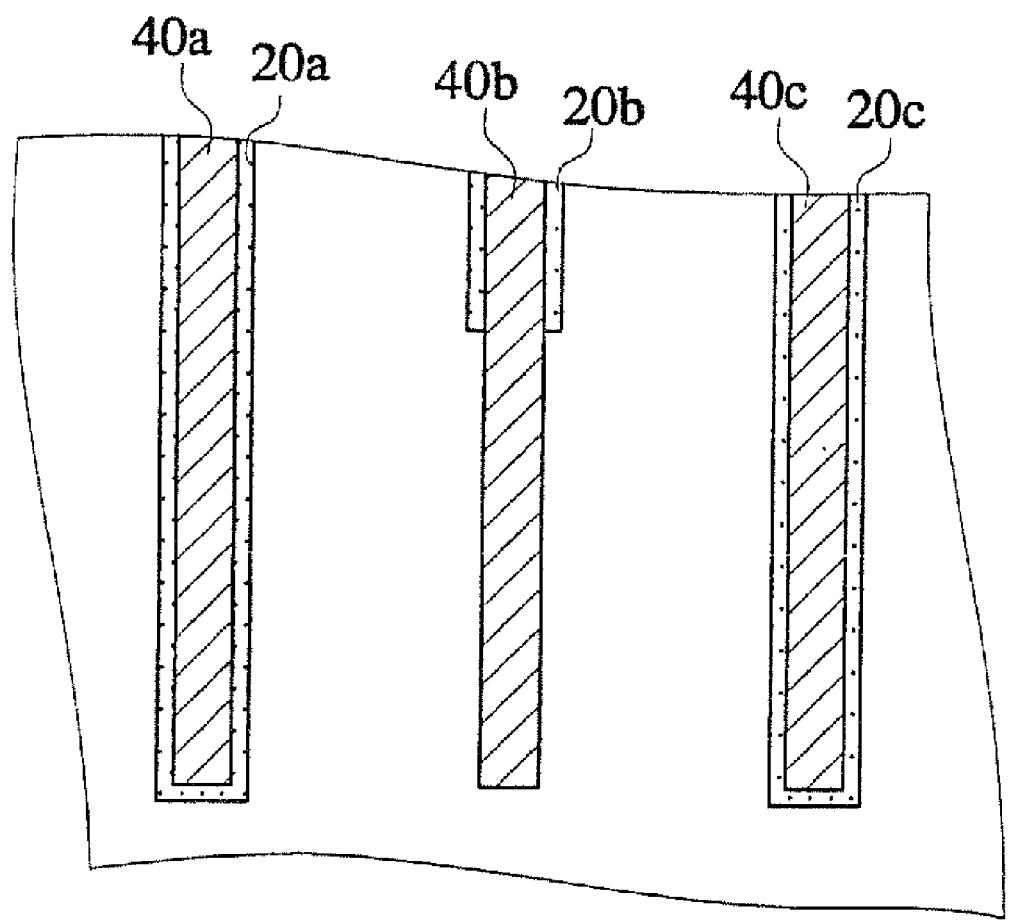
FIG. 1C is a plan diagram illustrating the first conventional photo mask and the second conventional photo mask aligned with the first photo mask.

The invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout the specification.

FIGS. 3A to 3E are plan diagrams illustrating a first photo mask for forming lower interconnection lines and second photo masks for forming upper interconnection lines according to an embodiment of the invention.

Figure 3A:
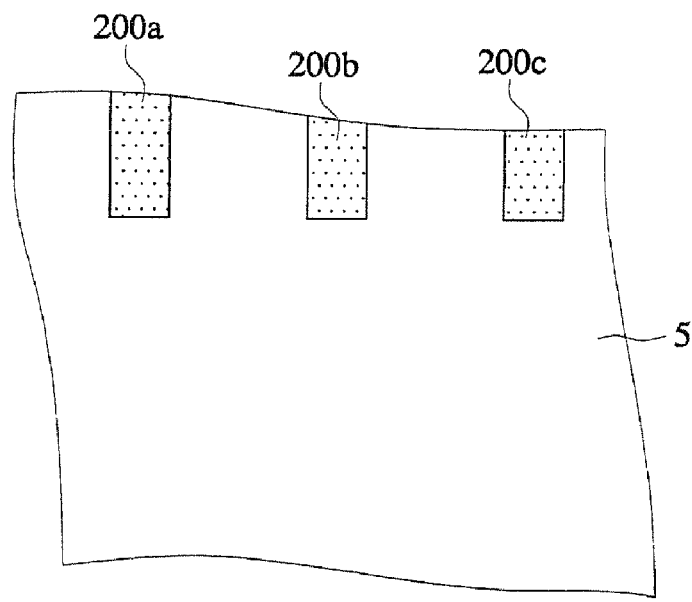
FIGS. 3A to 3E are plan diagrams useful for explaining photo mask sets according to embodiments of the invention.

Referring to FIG. 3A, a first lower opaque pattern 200a, a second lower opaque pattern 200b, and a third lower opaque pattern 200c are positioned parallel to each other on a first transparent substrate 5. The ends of the lower opaque patterns 200a, 200b, and 200c are all located on an imaginary straight line forming the lower boundary of the lower opaque patterns. In alternative embodiments, at least one of the lower opaque patterns 200a, 200b, and 200c may be extended to a maximum range of the step distance SD from the imaginary straight line.

Figure 3B:
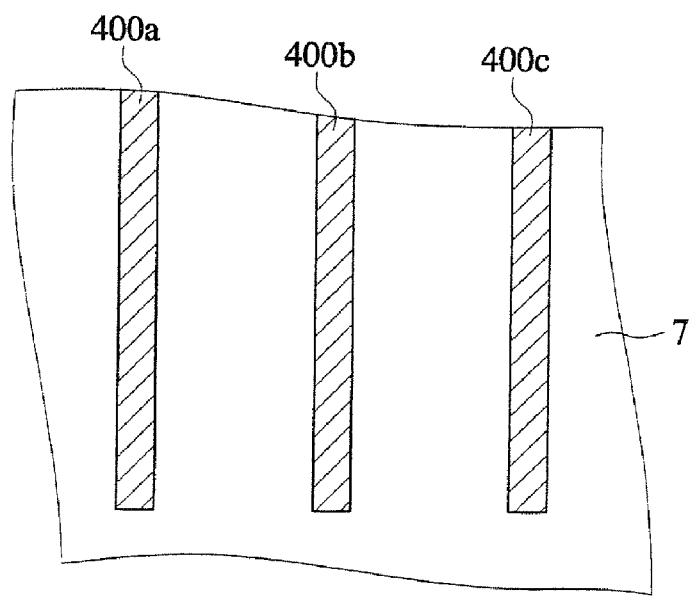
Figure 3C:
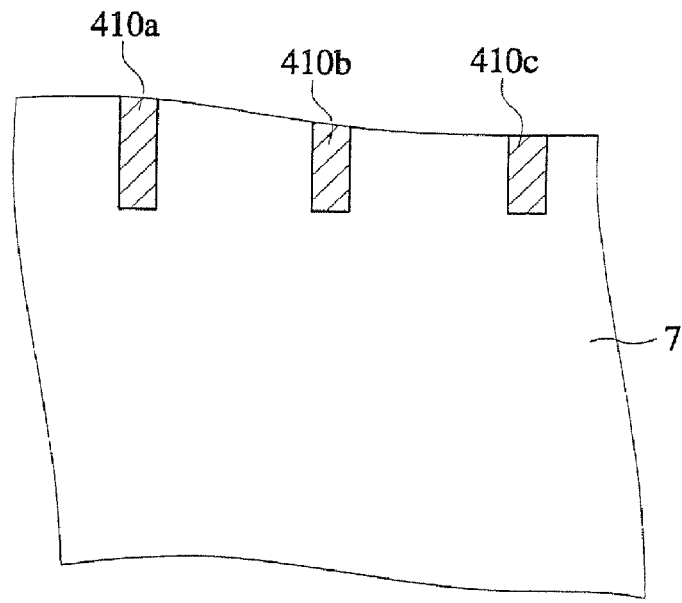
Figure 3D:
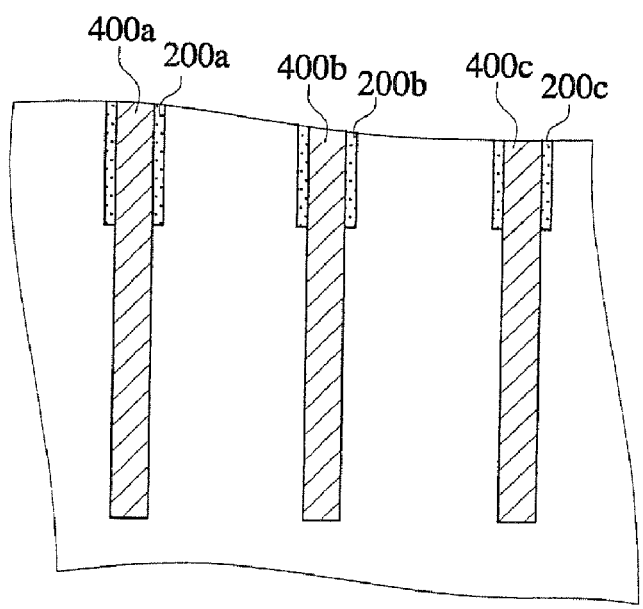

Referring to FIG. 3B, a first upper opaque pattern 400a, a second upper opaque pattern 400b, and a third upper opaque pattern 400c are positioned parallel to each other on a second transparent substrate 7. Alternatively, as shown in FIG. 3C, the first, second, and third upper opaque patterns 410a, 410b, and 410c, respectively, may be shorter than those shown in FIG. 3B but they are still positioned parallel to each other on a second transparent substrate 7. The first to third upper opaque patterns of FIG. 3B (400a, 400b, and 400c) or the first to third upper opaque patterns of FIG. 3C (410a, 410b and 410c) are positioned to be aligned with the first to third lower opaque patterns 200a, 200b, and 200c, respectively, of FIG. 3A. As shown in FIG. 3D, the upper opaque patterns 400a, 400b, and 400c, of FIG. 3B may extend over the ends of the lower opaque patterns 200a, 200b and 200c. Alternatively, as shown in FIG. 3E, the upper opaque patterns 410a, 410b, and 410c of FIG. 3C may be located entirely within the lower opaque patterns 200a, 200b, and 200c.

Figure 3E:
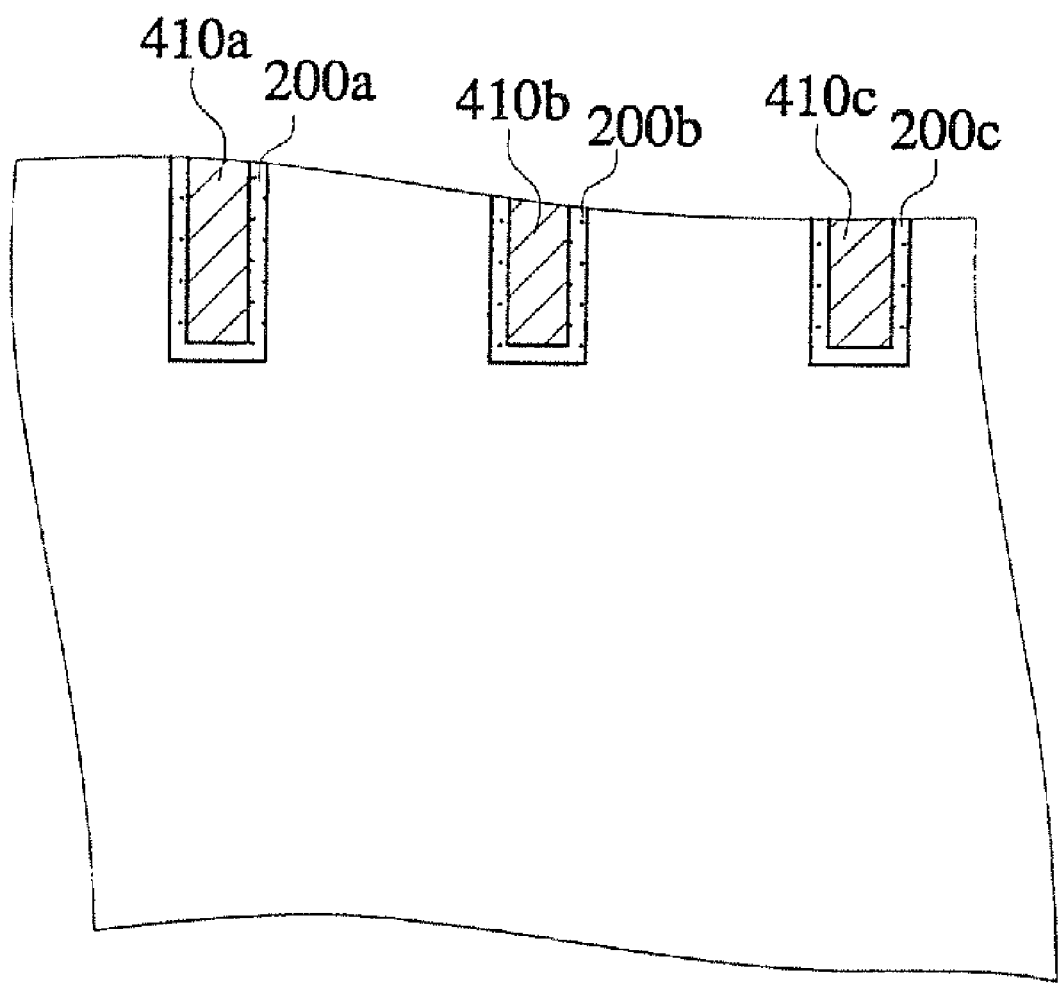

As shown in FIG. 3E, in the case where the upper opaque patterns 410a, 410b, and 410c are located within the lower opaque patterns 200a, 200b, and 200c, respectively, a poor photoresist pattern is prevented because any photoresist pattern formed is not located at an area where a reflected light is focused in a photolithography process for forming the upper interconnection lines. Accordingly, if multi-layered interconnection lines are formed using the photo masks shown in FIG. 3E, a poor quality upper interconnection line is prevented.

The case will now be explained where the upper opaque patterns 400a, 400b, and 400c are extended past ends of the lower opaque patterns 200a, 200b, and 200c, as shown in FIG. 3D.

Figure 4A:
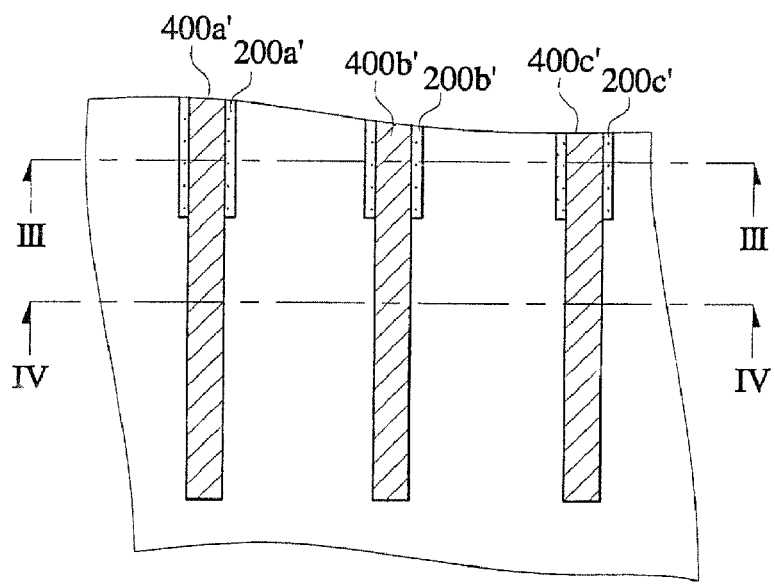
FIG. 4A is a plan diagram illustrating multi-layered interconnection lines fabricated according to an embodiment of the invention.

FIG. 4A is a plan diagram useful for explaining multi-layered interconnection lines fabricated using the first and second photo masks as shown in FIG. 3D.

Referring to FIG. 4A, lower interconnection lines 200a', 200b', and 200c' corresponding to the lower opaque patterns 200a, 200b, and 200c, respectively, are formed on a semiconductor substrate. Also, upper interconnection lines 400a', 400b', and 400c' corresponding to the upper opaque patterns 400a, 400b, and 400c, respectively, are formed over the semiconductor substrate. In this case, the ends of the upper interconnection lines 400a', 400b', and 400c' extend past the ends of the lower interconnection lines 200a', 200b', and 200c'.

Figure 4B:
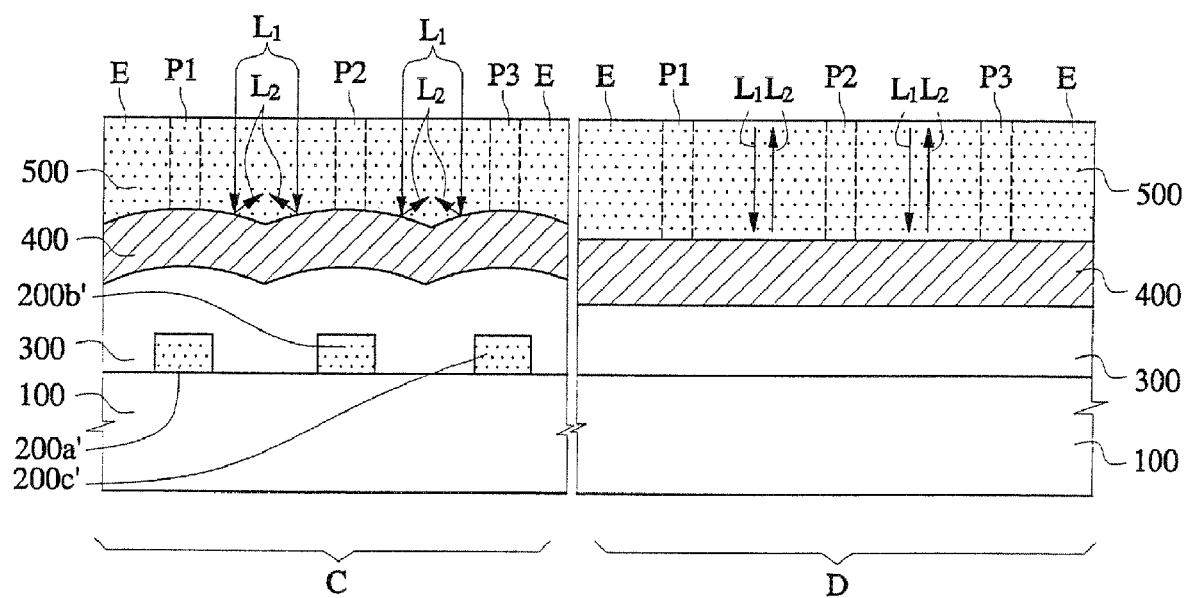
FIGS. 4B, 4E and 4F are cross sectional diagrams useful for explaining a method of forming multi-layered interconnection lines according to an embodiment of the invention.
Figure 4C:
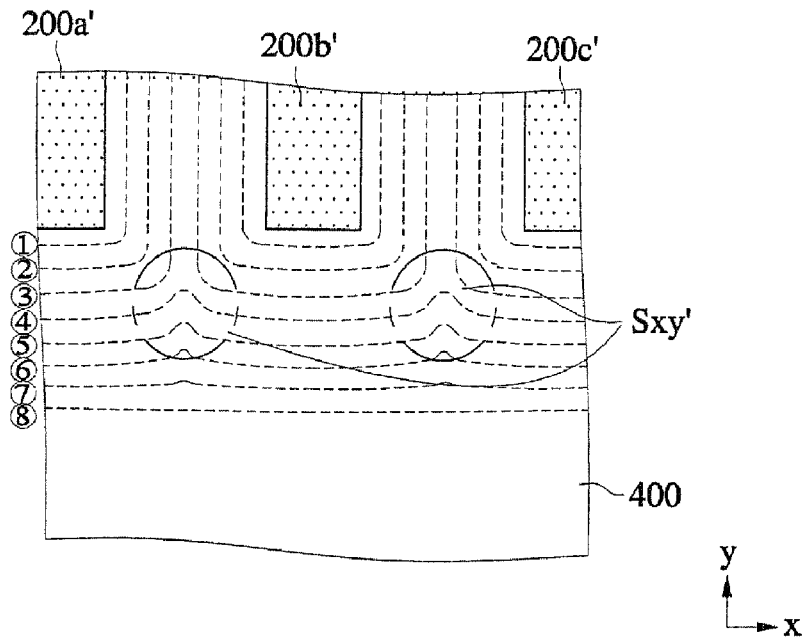
FIGS. 4C and 4D are plan diagrams useful for explaining the method of forming multi-layered interconnection lines according to an embodiment of the invention.
Figure 4D:
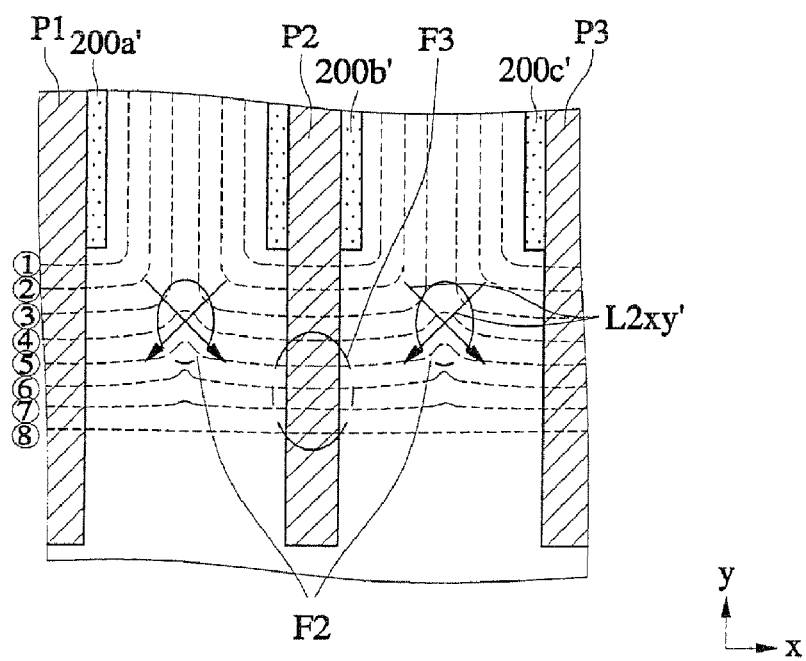
Figure 4E:
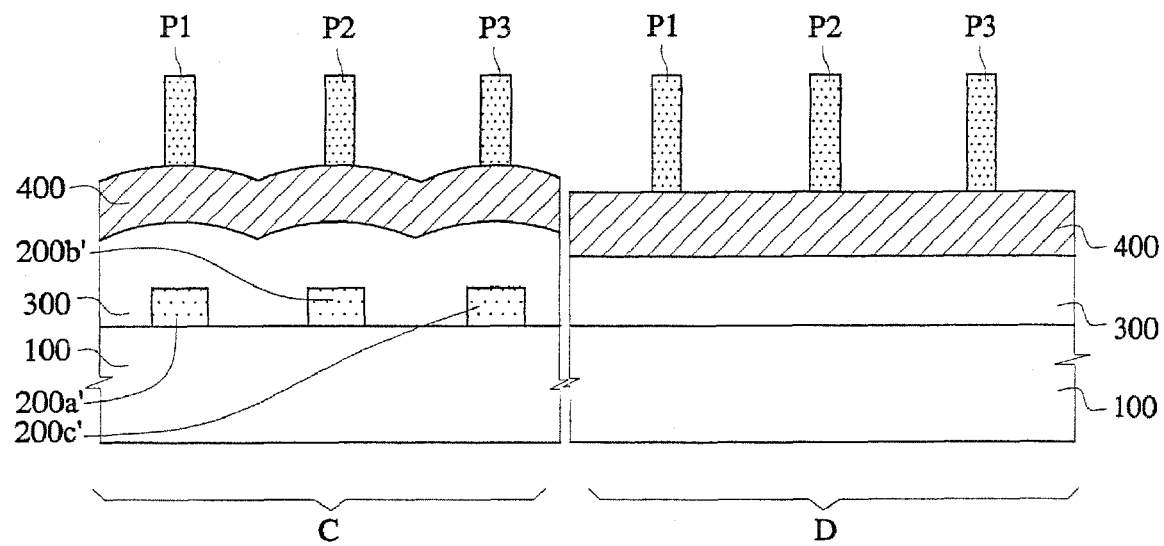
Figure 4F:
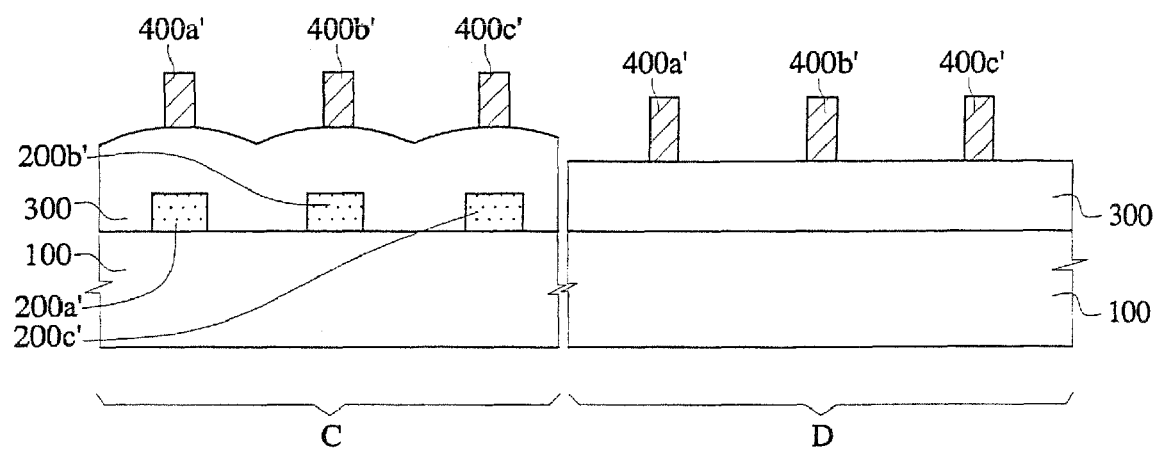

FIGS. 4B, 4E, and 4F are cross sectional diagrams useful for explaining a method of forming multi-layered interconnection lines using the photo masks shown in FIGS. 3A and 3B. In each of the drawings, a region indicated by a reference character "C" corresponds to a cross sectional view taken along a line III-III of FIG. 4A, and a region indicated by a reference character "D" corresponds to a cross sectional view taken along a line IV-IV of FIG. 4A.

Referring to FIG. 4B, a first lower interconnection line 200a', a second lower interconnection line 200b', and a third lower interconnection line 200c' are parallel with each other and formed on a semiconductor substrate 100 using the photo mask shown in FIG. 3A. The lower interconnection lines may be formed with a metal layer, a poly-silicon layer, or a metal-silicide layer. An interlayer insulating layer 300 is formed on the semiconductor substrate having the lower interconnection lines 200a', 200b', and 200c'. The interlayer insulating layer 300 may be formed with at least one layer selected from a group consisting of BoroPhosphoSilicate Glass (BPSG), Undoped Silicate Glass (USG), PhosphoSilicate Glass (PSG), and Plasma-Enhanced TetraEthyloSilicate (PE-TEOS) layers. The interlayer insulating layer 300 may have a sloped surface because of the lower interconnection lines 200a', 200b', and 200c'. However, there is no sloped surface at a position beyond a step distance SD from the ends of the lower interconnection lines 200a', 200b' and 200c'.

An upper conductive layer 400 is formed on the interlayer insulating layer 300. The upper conductive layer 400 has the same surface profile as the interlayer insulating layer 300 as shown in FIG. 4B.

A photoresist layer 500 is coated on the upper conductive layer 400. The photo resistive layer 500 is then exposed by a light L1 that passes through the second photo mask, which is shown in FIGS. 3B and 3D. As a result, the photoresist layer 500 is defined to have a first pattern region P1, a second pattern region P2, and a third pattern region P3 corresponding to the first to third upper opaque patterns 400a, 400b, and 400c of FIG. 3B and an exposure region E between the first to third pattern regions P1, P2 and P3. The applied light L1 is reflected on the sloped surfaces of the upper conductive layer 400. As a result, a reflected light L2 can be directed into the pattern regions P1, P2, and P3.

FIGS. 4C and 4D are plan diagrams useful for illustrating the sloped surfaces of the upper conductive layer 400 and a direction of the reflected lights L2.

Referring to FIG. 4C, contour lines ① to ⑧ represent equal heights of the surface of the upper conductive layer 400 on the semiconductor substrate. As the number increases from ① to ⑧, the surface of the upper conductive layer 400 is lowered. Accordingly, not only sloped surfaces parallel with the x-axis or the y-axis but also sloped surfaces Sxy' directed to axes between the x and y-axis are formed near the end of the second lower interconnection line 200b'.

Referring to FIG. 4D, the photoresist layer 500 is coated on the conductive layer 400, and then exposed by the light L1 that pass through the second photo mask as described with reference to FIG. 4B. In this case, as described above, the photoresist layer 500 is defined to have the first to third pattern regions P1, P2, and P3 corresponding to the first to third upper opaque patterns 400a, 400b, and 400c of FIG. 3B and the exposure region E.

In this case, a light L2xy' reflected on the sloped surfaces Sxy', which are directed to axes between x and y-axis, are at first focused at a first focus area F2 and then at a second focus area F3. But, the focusing of the reflected light L2xy' at the first focus area F2 has no effect on the formation of the photoresist pattern because the first focus area F2 is located in the exposure region E. Also, the focusing of the reflected light L2xy' at the second focus area F3 has no effect on the formation of the photoresist pattern because the intensity of the reflected light L2xy' at the second focus area F3 is weak and there is no reflected light on the sloped surfaces directed to the x-axis near the second focus area F3.

Referring to FIG. 4E, the photoresist layer 500 exposed by the light L1 is developed using a developer. As a result, the first to third photoresist patterns P1, P2, and P3 corresponding to the first to third pattern regions P1, P2, and P3 are formed on the upper conductive layer 400.

Referring to FIG. 4F, the conductive layer 400 is etched using the first to third photoresist pattern P1, P2, and P3 as etching masks. As a result, the first to third upper interconnection lines 400a', 400b', and 400c' corresponding to the first to third photoresist pattern P1, P2, and P3 are formed.

In spite of the sloped surfaces caused by the lower interconnection lines, a poor quality photoresist pattern is prevented because the reflected light L2 is not focused strongly at the pattern regions. Accordingly, poor quality patterns of the upper conductive layer 400a', 400b', and 400c' are prevented.

FIGS. 5A to 5D are plan diagrams useful for explaining first photo masks for forming lower interconnection lines and second photo masks for upper interconnection lines in accordance with another embodiment of the invention.

Figure 2A:
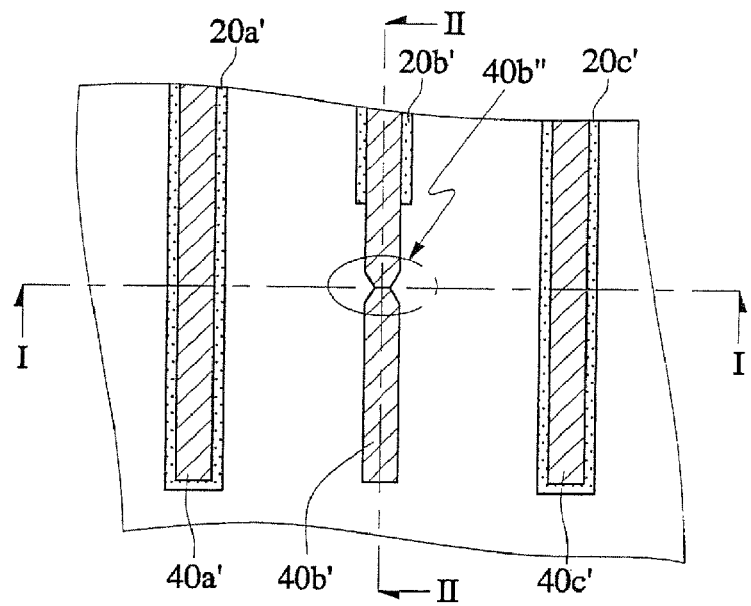
FIG. 2A is a plan diagram useful for explaining multi-layered interconnection lines fabricated using the first and second conventional photo masks, which are shown in FIGS. 1A and 1B.
Figure 2B:
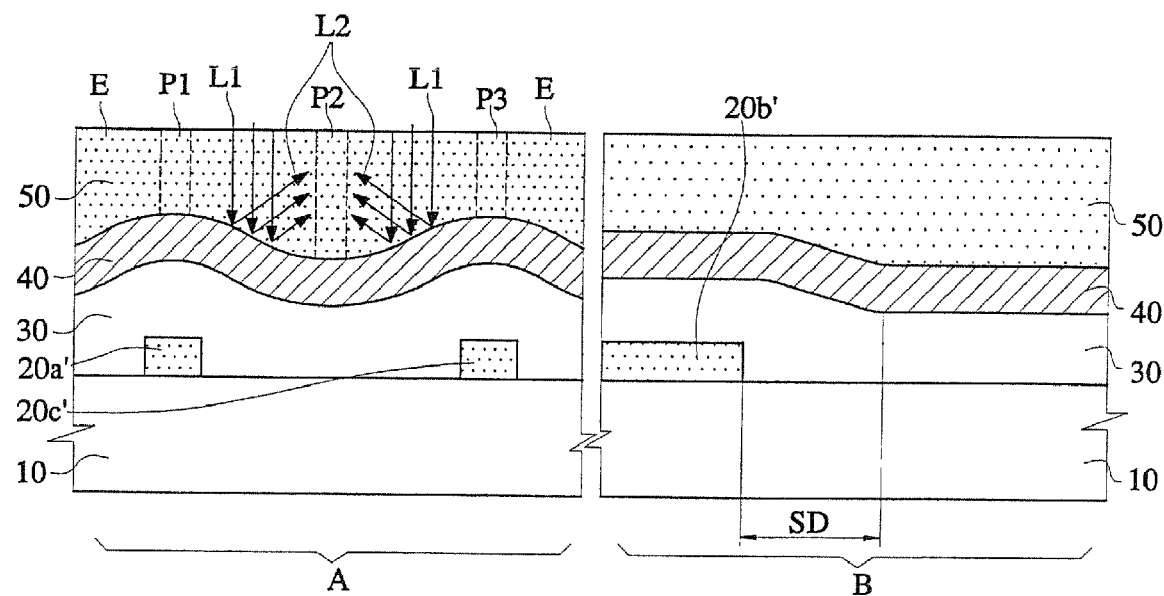
FIGS. 2B, 2E, and 2F are cross sectional diagrams useful for explaining a method of forming multi-layered interconnection lines using the conventional photo masks shown in FIGS. 1A and 1B.
Figure 2C:
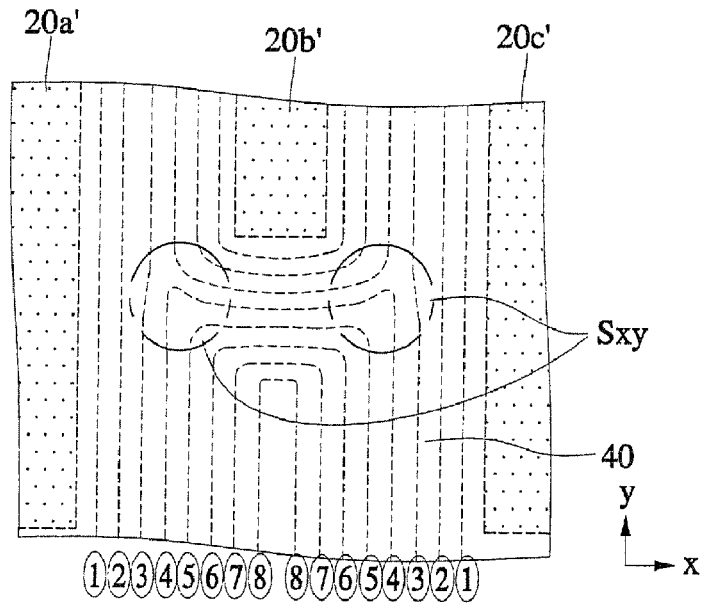
FIGS. 2C and 2D are plan diagrams illustrating sloped surfaces of an upper conductive layer and a direction of a reflected light.
Figure 2D:
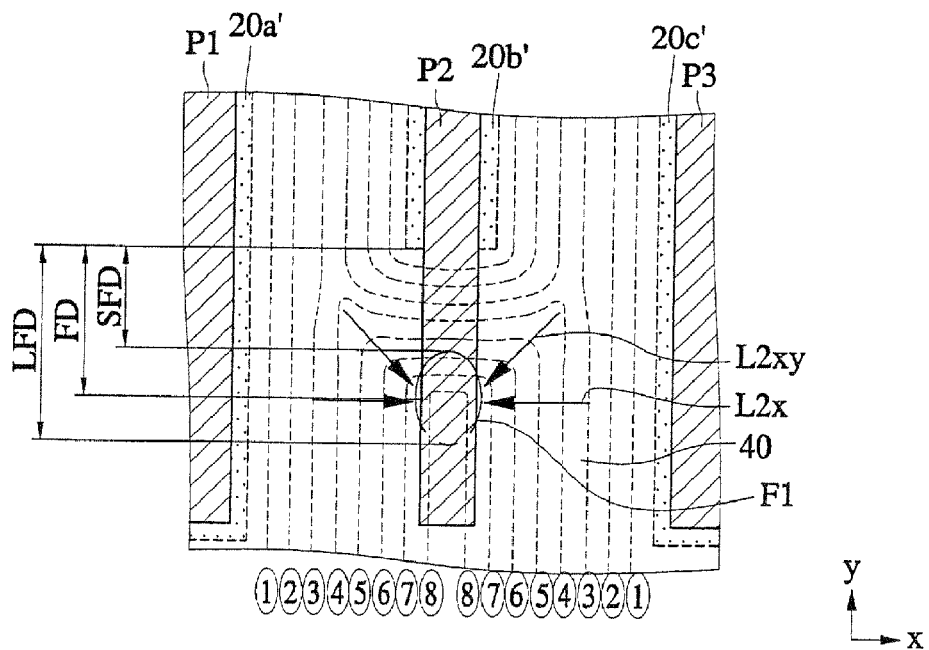
Figure 2E:
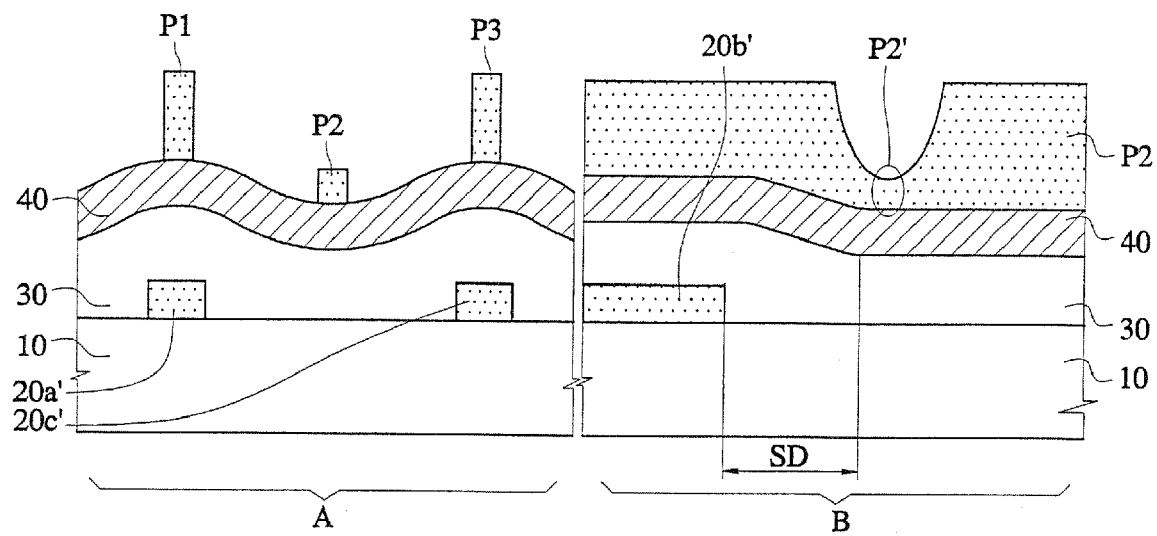
Figure 2F:
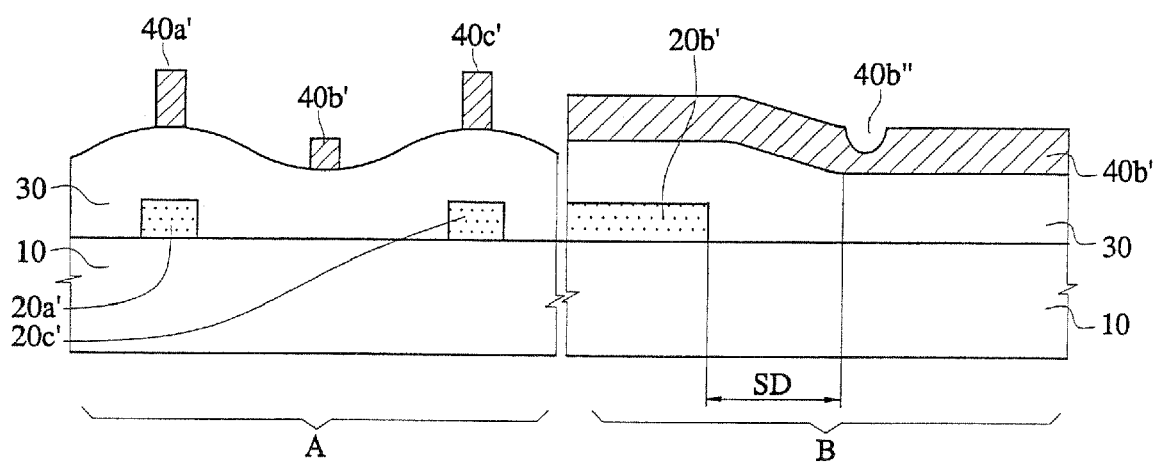
Figure 5A:
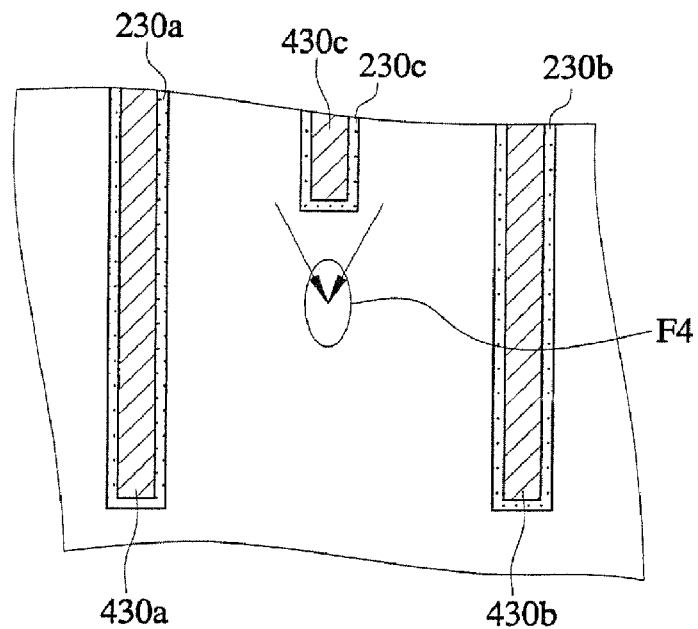
FIGS. 5A to 5D are plan diagrams illustrating photo mask sets according to other embodiments of the invention.

Referring to FIG. 5A, a first photo mask has a plurality of parallel lower opaque patterns formed on a first transparent substrate. The lower opaque patterns includes a first lower opaque pattern 230a and a second lower opaque pattern 230b adjacent to the first lower opaque pattern 230a as well as a third lower opaque pattern 230c located between the first and second lower opaque patterns 230a and 230c. In this case, the first and second lower opaque patterns 230a and 230b extend further than the third lower opaque pattern 230c. A second photo mask has a first upper opaque pattern 430a, a second upper opaque pattern 430b, and a third upper opaque pattern 430c formed on a second transparent substrate. The first to third upper opaque patterns 430a, 430b, and 430c are positioned to overlap with the first to third lower opaque patterns 230a, 230b, and 230c. Alternatively, the third upper opaque pattern 430c may be extended past the end of the third lower opaque pattern 230c up to a maximum range equal to the minimum focus distance SFD (shown in FIG. 2D). Accordingly, in the case where the multi-layered interconnection lines are formed using the first and second photo mask, poor quality photoresist patterns are prevented because no photoresist pattern is formed at a focus area F4 where the reflected light L2 is focused.

Figure 5B:
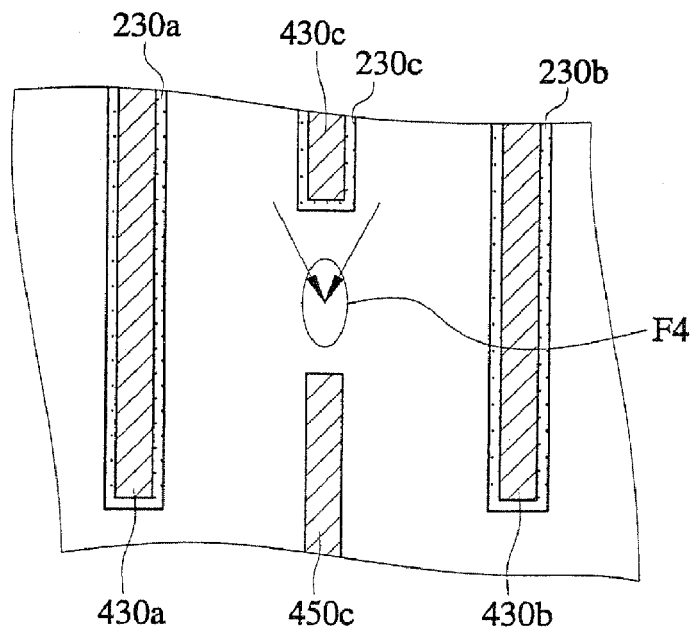

Referring to FIG. 5B, in addition to the first to third upper opaque patterns shown in FIG. 5A, the second photo mask also includes a fourth upper opaque pattern 450c aligned with the third upper opaque pattern 430c but at a distance from it. In this case, a distance between the fourth upper opaque pattern 450c and the third upper opaque pattern 430c that overlaps the third lower opaque pattern 230c is greater than the maximum focus distance LFD shown in FIG. 2D. Therefore, when multi-layered interconnection lines are formed using the first and second photo mask, poor quality photo resist patterns are prevented because no photoresist pattern is formed at the focus area F4 where the reflected light L2 is focused.

Figure 5C:
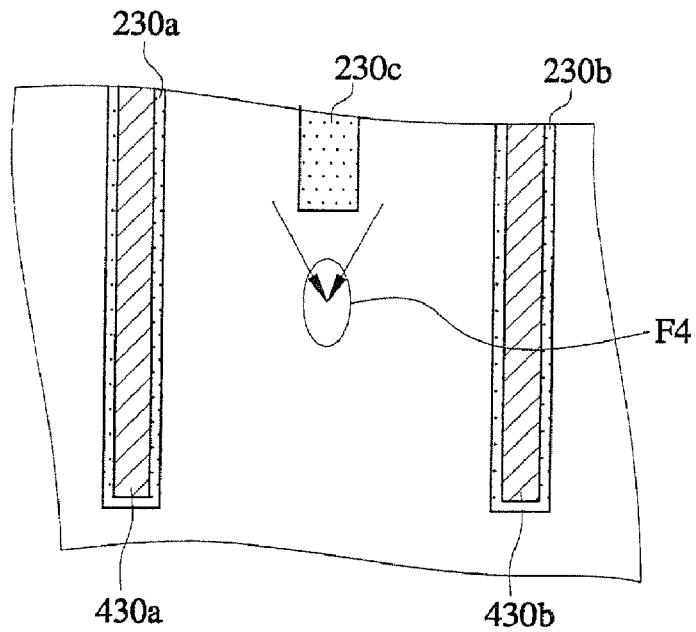

Referring to FIG. 5C, a first photo mask, as described with reference to FIG. 5A, has first to third lower opaque patterns 230a, 230b, and 230c formed on the first transparent substrate. A second photo mask has a first upper opaque pattern 430a and a second upper opaque pattern 430b on a second transparent substrate. The first and second upper opaque patterns 430a and 430b are disposed to overlap with the first and second lower opaque patterns 230a and 230b, respectively. Therefore, when multi-layered interconnection lines are formed using the first and second photo mask, poor quality photo resist patterns are prevented because no photoresist pattern is formed at the focus area F4 where the reflected light L2 is focused.

Figure 5D:
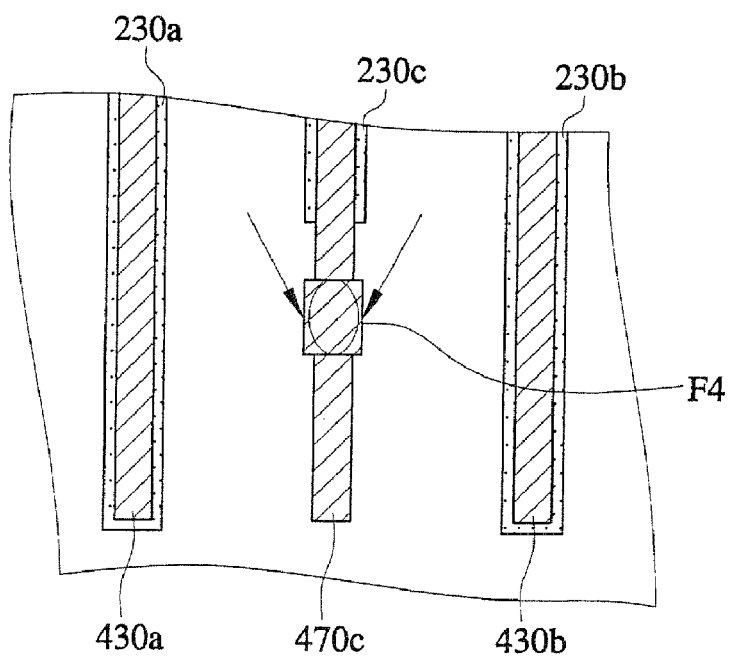

Referring to FIG. 5D, a photo mask set includes the first and second photo masks of FIG. 5C. In addition, the second photo mask further includes a third upper opaque pattern 470c formed to overlap with the third lower opaque pattern 230c. In this case, the third upper opaque pattern 470c extends past the end of the third lower opaque pattern 230c. A predetermined region of the third upper opaque pattern 470c is wider than the rest of the third upper opaque pattern. This predetermined region of the third upper opaque pattern 470c is located at the focus area F4. Therefore, when multi-layered interconnection lines are formed using the first and second photo mask, the focus area is exposed to reflected light. However, the upper interconnection line is not disconnected because the predetermined region of the photoresist pattern at the focus area is wide.

After lower interconnection lines are formed on a semiconductor substrate using each of the first photo masks described with reference to FIGS. 5A, 5B, and 5C, respectively, an interlayer insulating layer and an upper conductive layer are sequentially formed on the semiconductor substrate having the lower interconnection lines and sloped surfaces are formed on the upper conductive layer. As a result, the reflected light L2 is focused at the focus area F4 in a photolithography process for forming upper interconnection lines. However, poor quality photo resist patterns are prevented because the focus area F4 is confined to an exposure region.

Specific embodiments of the invention will now be described in a non-limiting way.

These embodiments include a first photo mask having a number of parallel lower opaque patterns formed on a first transparent substrate. The ends of the lower opaque patterns are even with a straight line crossing the lower opaque patterns. These embodiments also include a second photo mask having a plurality of parallel upper opaque patterns formed on a transparent substrate. The upper opaque patterns are positioned to overlap with the lower opaque patterns. Preferably, at least one of the upper opaque patterns extends past the end of the lower opaque pattern that it overlaps.

Embodiments of the invention may also include a first photo mask having a plurality of parallel lower opaque patterns formed on a first transparent substrate. The lower opaque patterns include a first lower opaque pattern and a second lower opaque pattern adjacent to the first lower opaque pattern as well as a third lower opaque pattern located between the first and second lower opaque patterns. The first and second lower opaque patterns extend past the end of the third lower opaque pattern. These embodiments also include a second photo mask having a first upper opaque pattern, a second upper opaque pattern, and a third upper opaque pattern formed on a second transparent substrate. The first, second, and third upper opaque patterns are disposed to overlap with the first, second, and third lower opaque patterns, respectively.

Alternatively, in addition to the first, second, and third upper opaque patterns, the second photo mask further includes a fourth upper opaque pattern that extends along the same line as the third upper opaque pattern, but is separated from it by a distance. In this case, the distance between the fourth upper opaque pattern and the third upper opaque pattern is greater than a maximum focus distance LFD.

Embodiments of the invention may also include a first photo mask having a plurality of parallel lower opaque patterns on a first transparent substrate. The lower opaque patterns include a first lower opaque pattern and a second lower opaque pattern adjacent to the first lower opaque pattern as well as a third lower opaque pattern located between the first and second lower opaque patterns. The first and second lower opaque patterns extend past the end of the third lower opaque pattern. These embodiments also include a second photo mask having a first upper opaque pattern and a second upper opaque pattern formed on a second transparent substrate. The first and second upper opaque patterns are positioned to overlap with the first and second lower opaque patterns, respectively. In addition to the first and second upper opaque patterns, the second photo mask further includes a third upper opaque pattern formed to overlap with the third lower opaque pattern. In this case, the third upper opaque pattern extends past the end of the third lower opaque pattern. Additionally, a predetermined region of the third upper opaque pattern is oversized to be wider than the rest of the third upper opaque pattern.

Embodiments of the invention may include a plurality of lower interconnection lines formed to be parallel in a single direction on a semiconductor substrate. The ends of the lower interconnection lines are all aligned with each other on a single straight line. An interlayer insulating layer covers an entire surface of the substrate having the lower interconnection lines. Upper interconnection lines are formed to overlap with the lower interconnection lines on the interlayer insulating layer. Preferably, the upper interconnection lines extend past the ends of the lower interconnection lines.

Embodiments of the invention may include a plurality of parallel lower interconnection lines formed on a semiconductor substrate. The lower interconnection lines include a first lower interconnection line, a second lower interconnection line, and a third lower interconnection line between the first and second lower interconnection lines. The first and second lower interconnection lines extend past the end of the third lower interconnection line. An interlayer insulating layer is formed on an entire surface of the substrate having the lower interconnection lines. A first upper interconnection line, a second upper interconnection line, and a third upper interconnection line is formed on the insulating layer. In this case, the first, second, and third upper interconnection lines overlap the first, second, and third lower interconnection lines, respectively. In addition to the first, second, and third upper interconnection lines, these embodiments may also include a fourth upper interconnection line formed on the insulating layer and extending in the same direction as the third upper interconnection line but separated from it. In this case, the distance between the fourth and third upper interconnection lines is greater than the maximum focus distance LFD.

Other embodiments of the invention include a plurality of parallel lower interconnection lines formed on a semiconductor substrate. The lower interconnection lines include a first lower interconnection line and a second lower interconnection line as well as a third lower interconnection line between the first and second lower interconnection lines. The first and second lower interconnection lines extend past the end of the third lower interconnection line. An interlayer insulating layer is formed on an entire surface of the substrate having the lower interconnection lines. A first upper interconnection line and a second upper interconnection line are formed on the insulating layer. In this case, the first and second upper interconnection lines are overlapped with the first and second lower interconnection lines, respectively.

Although several exemplary embodiments of the invention have been described, those of ordinary skill in the art will recognize that many more embodiments exist that fall within the spirit and scope of the invention. We claim all embodiments and equivalents of the invention as defined in the attached claims.

The invention claimed is:

1. A photo mask set comprising:
   a first photo mask having a plurality of parallel lower opaque patterns formed on a first transparent substrate, the lower opaque patterns comprising a first lower opaque pattern, a second lower opaque pattern, and a third lower opaque pattern located between the first and second lower opaque patterns, the first and second lower opaque patterns extending past an end of the third lower opaque pattern; and
   a second photo mask having a first upper opaque pattern, a second upper opaque pattern, and a third upper opaque pattern formed on a second transparent substrate, the first, second, and third upper opaque patterns positioned to overlap with the first, second, and third lower opaque patterns, respectively.

2. The photo mask set of claim 1, the second photo mask further comprising a fourth upper opaque pattern spaced from and extending along the same line as the third upper opaque pattern, wherein respective ends of the third and fourth upper opaque patterns are separated from each other by a distance being greater than a maximum focus distance.

3. A photo mask set comprising:
   a first photo mask having a plurality of parallel lower opaque patterns formed on a first transparent substrate, the lower opaque patterns including a first lower opaque pattern, a second lower opaque pattern, and a third lower opaque pattern located between the first and second lower opaque patterns, the first and second lower opaque patterns extending past an end of the third lower opaque pattern; and
   a second photo mask having a first upper opaque pattern and a second upper opaque pattern formed on a second transparent substrate, the first and second upper opaque patterns positioned to overlap with the first and second lower opaque patterns, respectively.

4. The photo mask set of claim 3, wherein the second photo mask further comprises a third upper opaque pattern formed to overlap with the third lower opaque pattern, the third upper opaque pattern extending past an end of the third lower opaque pattern, wherein a predetermined region of the third upper opaque pattern that extends past the end of the third lower opaque pattern is wider than the rest of the third upper opaque pattern.

5. A semiconductor device having multi-layered interconnection lines, the semiconductor device comprising:
   a plurality of parallel lower interconnection lines formed on a semiconductor substrate, the lower interconnection lines including a first lower interconnection line, a second lower interconnection line, and a third interconnection line between the first and second lower interconnection lines, the first and second lower interconnection lines extending past an end of the third lower interconnection line;
   an interlayer insulating layer formed on an entire surface of the substrate having the lower interconnection lines; and
   a first upper interconnection line and a second upper interconnection line formed on the insulating layer, the first and second upper interconnection lines overlapping the first and second lower interconnection lines, respectively.

6. The semiconductor device of claim 5, wherein the lower interconnection lines comprise a layer chosen from the group consisting of a poly-silicon layer, a silicide layer, and a metal layer.

7. The semiconductor device of claim 5, wherein the interlayer insulting layer comprises at least one layer selected from a group consisting of BPSG, USG, PSG, SOG and PE-TEOS.

8. The semiconductor device of claim 5, wherein the upper interconnection lines comprise a layer chosen from the group consisting of a poly-silicon layer, a silicide layer, and a metal layer.

9. A method of forming multi-layered interconnection lines in a semiconductor device, the method comprising:

providing a photomask set comprising (a) a first photo mask having a plurality of parallel lower opaque patterns formed on a first transparent substrate, the lower opaque patterns comprising a first lower opaque pattern, a second lower opaque pattern, and a third lower opaque pattern located between the first and second lower opaque patterns, the first and second lower opaque patterns extending past an end of the third lower opaque pattern, and (b) a second photo mask having a first upper opaque pattern, a second upper opaque pattern, and a third upper opaque pattern formed on a second transparent substrate, the first, second, and third upper opaque patterns positioned to overlap with the first, second, and third lower opaque patterns, respectively;

forming a plurality of parallel lower interconnection lines on the semiconductor substrate, wherein the lower interconnection lines are formed using the first photo mask of the photo mask set;

forming an interlayer insulating layer on the substrate and the lower interconnection lines; and forming a plurality of upper interconnection lines on the interlayer insulating layer, wherein the upper interconnection lines are formed using the second photo mask of the photo mask set.

10. A method of forming multi-layered interconnection lines in a semiconductor device, the method comprising:

providing a photomask set comprising (a) a first photo mask having a plurality of parallel lower opaque patterns formed on a first transparent substrate, the lower opaque patterns including a first lower opaque pattern, a second lower opaque pattern, and a third lower opaque pattern located between the first and second lower opaque patterns, the first and second lower opaque patterns extending past an end of the third lower opaque pattern, and (b) a second photo mask having a first upper opaque pattern and a second upper opaque pattern formed on a second transparent substrate, the first and second upper opaque patterns positioned to overlap with the first and second lower opaque patterns, respectively forming a plurality of parallel lower interconnection lines on the semiconductor substrate, wherein the lower interconnection lines are formed using the first photo mask of the photo mask set;

forming an interlayer insulating layer on the substrate and the lower interconnection lines; and forming a plurality of upper interconnection lines on the interlayer insulating layer, wherein the upper interconnection lines are formed using the second photo mask of the photo mask set.

* * * * *